Jan. 26, 1960

B. R. STACHIEWICZ 2,922,960

FREQUENCY CHANGING CIRCUIT

Filed April 14, 1958

INVENTOR.
BOGDAN R. STACHIEWICZ
BY F. H. Henson
ATTORNEY

United States Patent Office 2,922,960

Patented Jan. 26, 1960

2,922,960

FREQUENCY CHANGING CIRCUIT

Bogdan R. Stachiewicz, Sunnyvale, Calif., assignor to General Dynamics Corporation, Rochester, N.Y., a corporation of Delaware Application April 14, 1958, Serial No. 728,442

2 Claims. (Cl. 332—47)

This invention relates in general to electrical wave transmission systems and, more particularly, to frequency changing circuits for modulating or demodulating carrier waves for radio or carrier telephone use.

Modulator-demodulator circuits of the double balanced type accomplish the modulating function by a reversing switch process wherein the signal which is to be modulated upon a carrier frequency or demodulated from a carrier sideband is reversed at the carrier frequency rate. The reversal is accomplished by two pairs of oppositely poled rectifiers connected in bridge relationship between the input and output circuits. Conventionally, no external bias is applied to the rectifiers and the rectifiers are cyclically rendered conductive and non-conductive in pairs in alternating sequence by positive and negative half cycles, respectively, of the applied carrier voltage. It has been found that signal distortion is encountered in modulator-demodulators of the above described type since current varies exponentially with voltage in rectifiers operated in the forward direction. That is, signal distortion is produced because of the changing dynamic impedance of the rectifiers as the carrier voltage increases to the point where the knee of the forward current-voltage characteristic of the rectifiers is reached.

Accordingly, it is the general object of this invention to provide a new and improved frequency changing circuit.

It is a more particular object of this invention to provide a new and improved frequency changing circuit of the reversing switch type and in which signal distortion is reduced to a minimum.

The invention accomplishes the above cited objects by providing a frequency changing circuit of the reversing switch type which utilizes so-called Zener diodes as the principal elements thereof. A Zener diode is a semiconductor device comprising a rectifying p-n junction which for applied reverse voltages greater than a critical reverse voltage has a very low and substantially constant dynamic impedance. For reverse voltages below this critical voltage, the device presents a very high impedance and the switching transition from the very high impedance region to the very low impedance region is of the avalanche breakdown type.

In accordance with this invention, a fixed bias substantially equal to the critical reverse voltage is applied to the Zener diodes forming the principal elements of the reversing switch and the carrier voltage is superimposed on said fixed bias to alternately trigger said devices in pairs from their high impedance region to their low impedance region. A particular feature of the invention is that the fixed bias is derived from the voltage drop developed across a series connected pair of Zener diodes operated in their breakdown or low impedance region.

Further objects and advantages of the invention will be apparent as the following description proceeds, and features of novelty which characterize the invention will be pointed out in particularity in the claims annexed to and forming a part of this specification.

For a better understanding of the invention, reference may be had to the accompanying drawing which comprises two figures on a single sheet.

Figure 1:
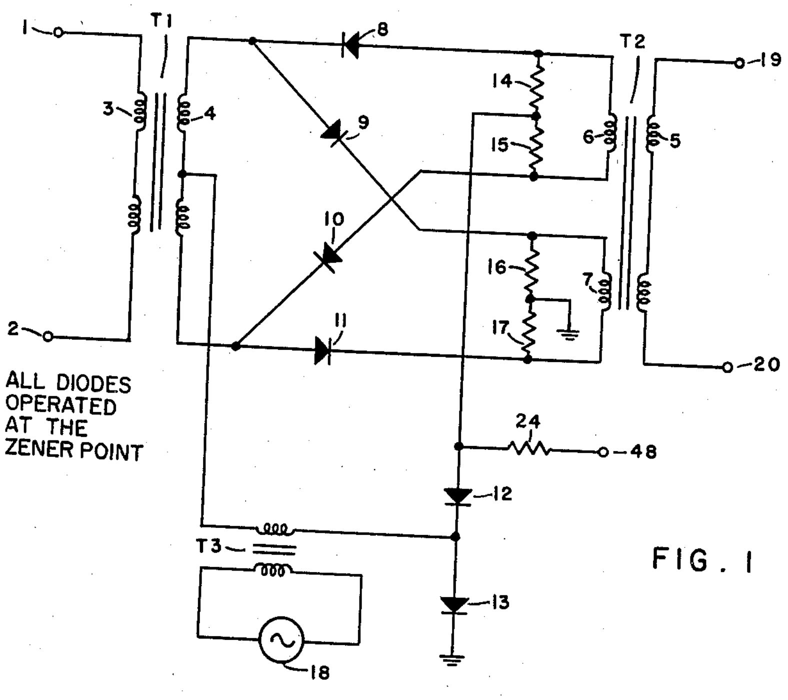
Fig. 1 shows a modulator-demodulator of the double balanced type.

The double balanced frequency changing circuit of Fig. 1 comprises first and second conjugate input-output transformers T1 and T2, respectively. It is immaterial which of the terminals 1, 2 or 19, 20 are used as input terminals or output terminals, or whether the frequency changing circuit is used as a modulator or a demodulator. If the illustrated circuit is used as a modulator, the signal frequency is applied to one pair of the terminals, the signal frequency and the carrier frequency are suppressed in the modulator, and the upper and lower sidebands of the carrier frequency modulated with the signal frequency appear at the other pair of terminals If the illustrated circuit is used as a demodulator, the carrier sideband is applied to one pair of said terminals, the carrier sideband and the carrier frequency are suppressed in the demodulator, and the demodulated signal frequency appears at the other pair of terminals.

The first transformer T1 is provided with primary winding 3 and a center-tapped secondary winding 4, and the second transformer T2 is provided with primary winding 5 and first and second secondary windings 6 and 7, respectively. Diodes 8, 9, 10, and 11 are connected in a bridge or reversing switch configuration between transformers T1 and T2. Oppositely poled diodes 8 and 9 are connected between the upper terminal of center-tapped winding 4 and the upper terminals of secondary windings 6 and 7, respectively, while oppositely poled diodes 10 and 11 are connected between the lower terminal of center-tapped winding 4 and the lower terminals of secondary windings 6 and 7, respectively. Windings 6 and 7 are oppositely poled with respect to primary winding 5 of transformer T2 and since, in practice, windings 6 and 7 are wound in the same direction on the core of transformer T2, the polarity of the windings is determined by the connection of the winding terminals.

Figure 2:
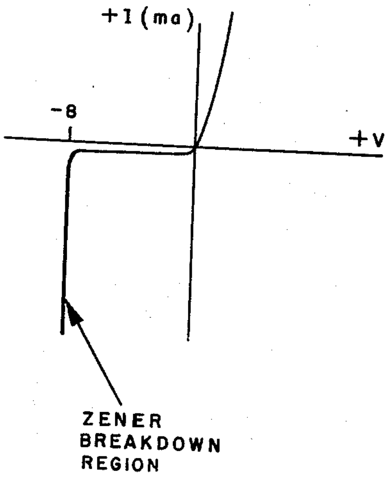
Fig. 2 shows the current-voltage characteristic curve of a semiconductor device suitable for use in the circuit of Fig. 1.

Bias is obtained for the bridge diodes 8, 9, 10, and 11 from the voltage drop developed across diodes 12 and 13, which are of the same type as diodes 8—11 and thus have the same critical reverse voltage value. It can be seen that diodes 12 and 13 are connected in series with current limiting resistor 14 between a source of negative potential, which may be minus forty-eight volts, and a point of reference or ground potential. The source of negative potential must have a voltage equal to at least twice the critical reverse voltage of the diodes 12 and 13 so that these diodes will be operated in their low impedance region. In a tested embodiment of the invention, diodes 8–13, inclusive, were type IN438 and had a critical reverse voltage of eight volts, as illustrated in Fig. 2, which is a graphical illustration of the forward and reverse current-voltage characteristic of a type IN438 diode. For applied reverse voltages less than eight volts, a type IN438 diode presents a very high impedance and for applied reverse voltages greater than eight volts, the diode is triggered into a substantially constant voltage or very low impedance region. Also as illustrated in Fig. 2, the transition between the high impedance and the low impedance regions is extremely fast. In the illustrated circuit, diodes 12 and 13 are operated in their constant voltage regions, minus eight volt potential appears at the anode terminal of diode 13, and minus sixteen volt potential appears at the anode terminal of diode 12.

The potential appearing at the anode terminal of diode 13 is applied through the secondary winding of carrier insertion transformer T3 to the center tap of center-tapped winding 4 and thus to the cathode terminals of diodes 8 and 10, and to the anode terminals of diodes 9 and 11. The anode terminals of diodes 8 and 10 are returned through resistors 14 and 15, which are connected in series across secondary winding 6 of transformer T2, respectively, to the potential appearing at the anode terminal of diode 12, while the cathode terminals of diodes 9 and 11 are returned through resistors 16 and 17, which are connected in series across the secondary winding 7 of transformer T2, respectively, to a point of reference or ground potential. Thus, each of the diodes 8, 9, 10, and 11 is biased in the reverse direction by a voltage slightly less than the critical reverse voltage. The voltage applied to each of the diodes 8–11, inclusive, is slightly less than the critical reverse voltage because of the small voltage drop appearing across the series resistors 14–17, inclusive, and which is produced by the extremely small current flow through the reverse biased diodes. A low resistance potentiometer can be connected between the cathode terminal of diode 12 and the anode terminal of diode 13 with the adjustable contact connected to the secondary of transformer T3 if adjustment of the bias applied to the bridge diodes is required.

During the half cycles of the carrier voltage, produced by carrier oscillator 18 and induced in the secondary winding of transformer T3, in which the center tap of winding 4 goes positive with respect to minus eight volts, the reverse voltage across diodes 8 and 10 exceeds the critical reverse voltage and these diodes are driven into their substantially constant voltage or low impedance region. During the half cycles of the carrier voltage in which the center tap of winding 4 goes negative with respect to minus eight volts, the reverse voltage across diodes 9 and 11 exceeds the critical reverse voltage and these diodes are driven into their constant voltage or low impedance region. Thus, the bridge diodes are cyclically rendered conductive and non-conductive in pairs in alternating sequence by alternating half cycles of the applied carrier voltage. Resistors 14, 15, 16, and 17 serve the purpose of offsetting any unbalance in the circuit due to variance in the critical reverse voltage or trigger points between the individual diodes of the bridge circuit. Resistors 14, 15, 16, and 17 may, of course, be replaced with potentiometers if an exact balance is required.

While there has been shown and described what is at present considered to be the preferred embodiment of the invention, modifications thereto will readily occur to those skilled in the art. It is not desired, therefore, that the invention be limited to the embodiment shown and described and it is intended in the appended claims to cover all such modifications as fall within the true spirit and scope of the invention.

What is claimed is:

1. A frequency changing circuit comprising first and second conjugate input-output transformers, said first transformer having a primary winding for connection to a line and a center-tapped secondary winding, said second transformer having a primary winding for connection to a line and first and second secondary windings, a pair of resistors connected in series across each of said first and second windings, first, second, third, and fourth semiconductor devices, each of said devices comprising a p-n junciton which for applied reverse voltages greater than a critical reverse voltage has a very low and substantially constant dynamic impedance, means for connecting said first device between one end of said center-tapped winding and one end of said first winding, means for connecting said second device between said one end of said center-tapped winding and one end of said second winding, said one ends of said first and second windings being oppositely poled with respect to the primary winding of said second transformer, means for connecting said third device between the other end of said center-tapped winding and the other end of said first winding, means for connecting said fourth device between said other end of said center-tapped winding and the other end of said second winding, the two devices connected to each end of said center-tapped winding being oppositely poled with respect to said center-tapped winding, biasing means including a first point of potential equal to said critical reverse voltage, a second point of potential equal to twice said critical reverse voltage, and a point of reference potential, a source of carrier voltage, means for connecting said source of carrier voltage between the center tap of said center-tapped winding and said first point of potential, means for returning the junction point of the pair of resistors connected across said first winding to said second point of potential, means for returning the junction point of the pair of resistors connected across said second winding to said point of reference potential, and said devices also being poled so as to be biased in the reverse direction by said biasing means.

2. A frequency changing circuit comprising first and second conjugate input-output transformers, said first transformer having a primary winding for connection to a line and a center-tapped secondary winding, said second transformer having a primary winding for connection to a line and first and second secondary windings, a pair of resistors connected in series across each of said first and second windings, first, second, third, fourth, fifth, and sixth semiconductor devices each having first and second terminals, each of said devices comprising a p-n junction which for applied reverse voltages greater than a critical reverse voltage has a very low and substantially constant dynamic impedance, means for connecting the first and second terminals of said first device to one end of said first winding and to one end of said center-tapped winding, respectively, means for connecting the first and second terminals of said second device to said one end of said center-tapped winding and to one end of said second winding, respectively, said one ends of said first and second windings being oppositely poled with respect to the primary winding of said second transformer, means for connecting the first and second terminals of said third device to the other end of said first winding and to the other end of said center-tapped winding, respectively, means for connecting the first and second terminals of said fourth device to said other end of said center-tapped winding and to the other end of said second winding, respectively, means for returning the first terminal of said fifth device to a point of potential having a voltage value greater than twice said critical reverse voltage through a current limiting resistor, means for connecting the second terminal of said fifth device to the first terminal of said sixth device, means for returning the second terminal of said sixth device to a point of reference potential, means for connecting a source of carrier voltage between the center tap of said center-tapped winding and the second terminal of said fifth device, means for connecting the junction point of the pair of resistors connected across said first winding to the first terminal of said fifth device, and means for connecting the junction point of the pair of resistors connected across said second winding to said point of reference potential.

References Cited in the file of this patent

UNITED STATES PATENTS

| | | |
|---|---|---|
| 2,456,494 | Ensink | Dec. 14, 1948 |
| 2,631,356 | Sparks et al. | Mar. 17, 1953 |
| 2,714,702 | Shockley | Aug. 2, 1955 |
| 2,829,282 | Hughes et al. | Apr. 1, 1958 |